A white light generating device, for generating white light from an excitation light of a laser light having a wavelength of from 280 nm-495 nm, includes a fluorescent body generating a fluorescence having a wavelength longer than a wavelength of the excitation light. The fluorescent body includes an emission-side end surface emitting excitation light and fluorescence, an opposing end surface on an opposite side of the emission-side end surface, and an outer peripheral surface. The emission-side end surface has an area larger than an area of the opposing end surface, and the outer peripheral surface of the fluorescent body includes a part inclined with respect to a central axis of the fluorescent body by from 3.4°-23° over an entire periphery of the fluorescent body. The emission-side end surface has an area of from 0.3 mm²-1.52 mm².

(12) United States Patent
Kondo et al.

(10) Patent No.: US 11,561,333 B2
(45) Date of Patent: *Jan. 24, 2023

(54) WHITE-LIGHT GENERATING DEVICE WITH FLUORESCENT BODY WITH INCLINED SIDE SURFACE

(71) Applicant: NGK INSULATORS, LTD., Nagoya (JP)

(72) Inventors: Jungo Kondo, Miyoshi (JP); Yuichi Iwata, Nagoya (JP); Tetsuya Ejiri, Kasugai (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/994,014

(22) Filed: Aug. 14, 2020

(65) Prior Publication Data

US 2020/0371278 A1    Nov. 26, 2020

Related U.S. Application Data

(63) Continuation of application No. PCT/JP2018/005408, filed on Feb. 16, 2018.

(51) Int. Cl.
*F21V 8/00* (2006.01)
*F21V 9/08* (2018.01)

(52) U.S. Cl.
CPC .............. *G02B 6/0003* (2013.01); *F21V 9/08* (2013.01); *G02B 6/0008* (2013.01)

(58) Field of Classification Search
CPC ........ G02B 6/0003; G02B 2006/12097; G02B 6/12; G02B 6/12002; A61B 1/0653;
(Continued)

(56) References Cited

U.S. PATENT DOCUMENTS 7,505,655 B2    3/2009  Yamazaki et al.
8,369,005 B2    2/2013  Yamamoto
(Continued)

FOREIGN PATENT DOCUMENTS

JP    4299826 B2    6/2007
JP    5214193 B2    2/2009
(Continued)

OTHER PUBLICATIONS

International Preliminary Report on Patentability, issued in corresponding International Application No. PCT/JP2018/005408, dated Aug. 27, 2020 (2 pages).
(Continued)

*Primary Examiner* — Elmito Breval
*Assistant Examiner* — Steven Y Horikoshi
(74) *Attorney, Agent, or Firm* — Flynn Thiel, P.C.

(57) ABSTRACT

8 Claims, 12 Drawing Sheets

(58) Field of Classification Search
CPC .......... F21S 41/16; F21S 41/24; F21S 41/176; F21V 9/30; F21V 13/08; F21V 9/08; F21V 29/502; H01S 5/0087; H01S 5/0287; H01S 5/22; H01S 5/2202; H01S 5/223; H01S 2301/163; G03B 21/06; G03B 21/204
See application file for complete search history.

(56) References Cited

U.S. PATENT DOCUMENTS

| | | | |
|---|---|---|---|
| 10,859,747 B2* | 12/2020 | Kondo | ............. G02B 6/0003 |
| 2003/0128341 A1 | 7/2003 | Li | |
| 2015/0077972 A1* | 3/2015 | Sugiyama | ........... H01S 5/02257 362/553 |
| 2015/0370002 A1 | 12/2015 | Bolander et al. | |
| 2018/0100627 A1* | 4/2018 | Tamura | ................ F21V 7/04 |

FOREIGN PATENT DOCUMENTS

| | | |
|---|---|---|
| JP | 5679435 B2 | 9/2012 |
| JP | 201560871 A | 3/2015 |
| WO | 2016170803 A1 | 10/2016 |
| WO | 2017119313 A1 | 7/2017 |

OTHER PUBLICATIONS

English Translation of the Written Opinion of the International Search Authority, issued in corresponding International Application No. PCT/JP2018/005408, dated Apr. 24, 2018 (4 pages).

J.W. Raring et al., "Laser Diode Phosphor Modules For Unprecedented SSL Optical Control", Illuminating Engineering Society Annual Conference 2016, Oct. 23-25, 2016, Orlando, Florida, USA (6 pages).

English Translation (machine) of Notice of Reasons for Refusal issued in corresponding Japanese Application JP 2019-532144 dated May 28, 2020 (3 pages).

International Search Report with English Translation issued in corresponding International Application No. PCT/JP2018/005408 dated Apr. 24, 2018 ( 5 pages).

Written Opinion of International Searching Authority issued in corresponding International Application No. PCT/JP2018/005408 dated Apr. 24, 2018 (3 pages).

German Office Action issued in corresponding German Application No. 11 2018 006 802.1, dated Nov. 21, 2022 (10 pages).

* cited by examiner

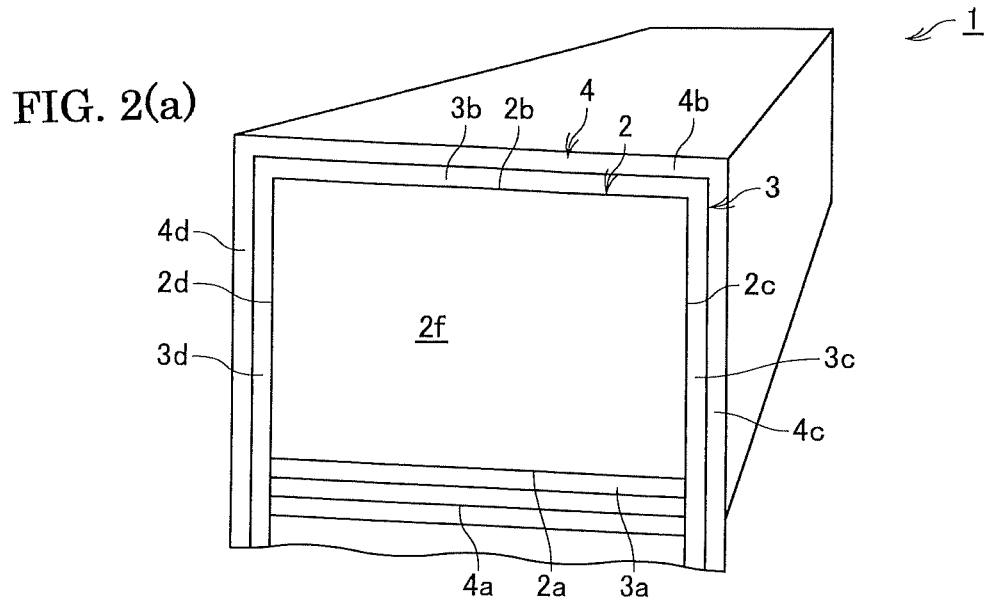
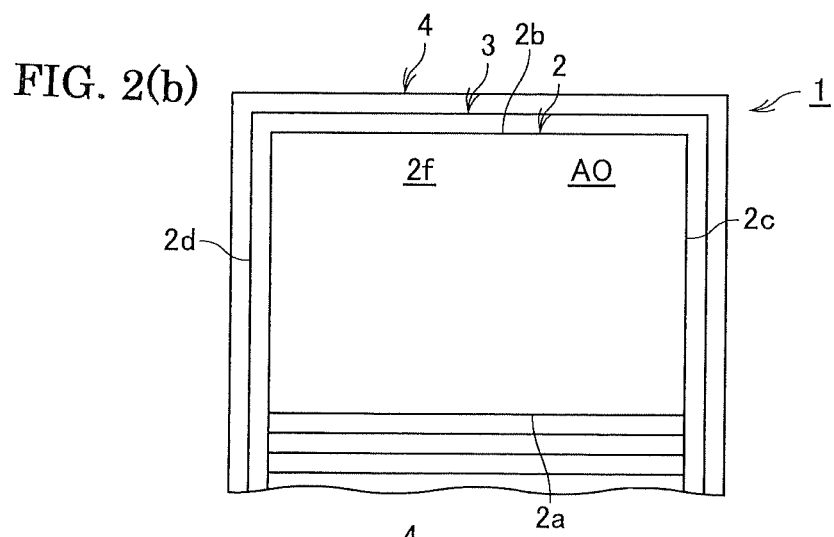
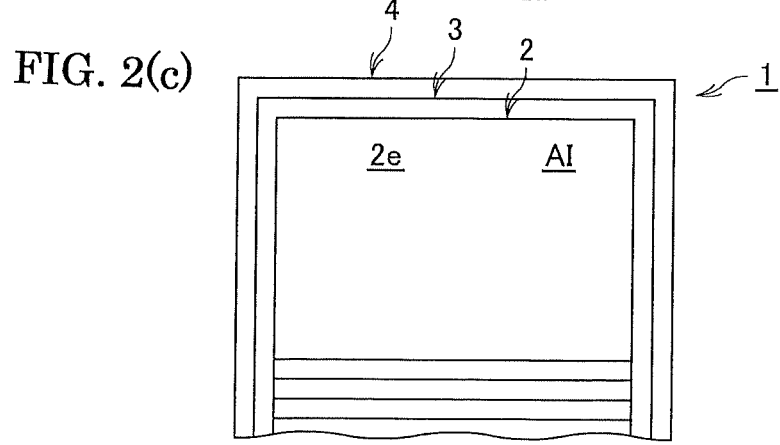

WHITE-LIGHT GENERATING DEVICE WITH FLUORESCENT BODY WITH INCLINED SIDE SURFACE

CROSS-REFERENCE TO RELATED APPLICATIONS

This is a continuation application of PCT/JP2018/005408, filed Feb. 16, 2018, the entire contents of which is hereby incorporated by reference.

TECHNICAL FIELD

The present invention relates to a device and illumination system for generating white light from blue laser light, blue-violet laser light or the like.

BACKGROUND ARTS

Recently, intensive studies have been undertaken in headlights for a vehicle employing a laser light source, and one thereof is a white light source constructed by combining a blue laser or ultraviolet laser and a fluorescent body. The light density of an excitation light can be increased by condensing the laser light and, moreover, the light intensity of the excitation light can also be increased by condensing multiple beams of laser light so as to overlap on the fluorescent body. As a result, the light flux and brightness can simultaneously be increased without changing a light emission area. Therefore, a white light source that combines a semiconductor laser and a fluorescent body with each other is attracting attention as a light source that replaces the LED. For example, as fluorescent body glass used for the vehicle headlight, a fluorescent body glass "Lumiphous™" from Nippon Electric Glass and YAG monocrystal fluorescent bodies from National Institute for Materials Science, Tamura Corporation, and Koha Co., Ltd. are proposed.

As to a white light laser, non-patent document 1 discloses the structure from SORAA corporation in The United States. According to the laser, the light of an excitation laser is made directly incident onto a fluorescent body diagonally upward to form a reflection film on the opposite side of the fluorescent body, so that the excitation light and fluorescence are reflected to emit white light upwardly. The white light laser can integrate and miniaturize an excitation laser and fluorescent body to obtain an illumination light having a high directivity, so that it is expected to be suitable in applications as light sources for a specialized use and optical communication.

Further, Patent document 1 describes a white light emitting apparatus including a fluorescence fiber. According to the apparatus, an excitation light is made incident onto an optical fiber made of a fluorescent body to emit a white light from a side peripheral surface of the optical fiber.

Further, according to patent document 2, an outer peripheral surface of an optical fiber made of a fluorescent body is covered with a metal film, an excitation light is made incident onto the optical fiber and a white light is emitted from an emission-side end surface of the optical fiber.

Further, according to patent document 3, a white light from an LED light source is made incident onto a fluorescent body to emit a white light from a luminous surface of the fluorescent body. At this time, the inclination angle of an outer peripheral surface of the fluorescent body with respect to the optical axis is 15 to 35° and preferably is 30 to 35°. By increasing the inclination angle, the amount of light reaching the luminous surface upon reflection is increased. As to the dimensions of the fluorescent body, the width is typically 50 mm or larger (Refer to FIG. 7 of patent document 3).

BACKGROUND DOCUMENTS

Non-Patent Documents (Non-patent document 1) J. W. Raring et al., "Laser diode phosphor modules for unprecedented SSL optical control," 2016 Illuminating Engineering Society (IES) Annual Conference, Orlando, Fla. (Oct. 24, 2016).

Patent Documents (Patent document 1) Japanese Patent No. 4299826B
(Patent document 2) Japanese Patent No. 5214193B
(Patent document 3) Japanese Patent No. 5679435B

SUMMARY OF THE INVENTION

However, according to the structure described in non-patent document 1, the efficiency of extracting the fluorescence is low and the excitation light is leaked from the direction of the side surface of the fluorescent body. An absorbing material is required for Beam Dump, meaning that the laser light for the excitation is also lost.

According to the structure described in patent document 1, it is difficult to obtain a white light having a high intensity and directivity and the fluorescence and excitation light are emitted from various positions of the outer peripheral surface, resulting in a color unevenness of the white light.

According to the structure described in patent document 2, a light having a high directivity can be obtained. It is, however, proved that there is a limit on the efficiency (light extraction efficiency) of extracting a fluorescence converted from the excitation light to the side of emission.

The inventors further tried to irradiate a blue light onto the fluorescent body described in patent document 3 to generate a white light. Although it is thereby possible to increase the amount of light emitted from the luminous surface of the fluorescent body, it is proved that a considerable color unevenness is observed in the light emitted from the luminous surface of the fluorescent body and that a uniform white light cannot be obtained.

An object of the present invention is, in a device of making an excitation light incident onto a fluorescent body and of radiating the excitation light and a fluorescence to obtain a white light, to improve the extraction efficiency of the white light from the fluorescent body and to prevent a color unevenness of the thus obtained white light.

The white light generating device of the present invention has an excitation light comprising a laser light having a wavelength of 280 nm or longer and 495 nm or shorter and comprises a fluorescent body generating a fluorescence having a wavelength longer than a wavelength of the excitation light, the fluorescent body comprising an emission-side end surface emitting the excitation light and the fluorescence, an opposing end surface on an opposite side of the emission-side end surface, and an outer peripheral surface, wherein the emission-side end surface has an area larger than an area of the opposing end surface, wherein the outer peripheral surface of the fluorescent body comprises an inclined part inclined with respect to a central axis of the fluorescent body by 3.4° or larger and 23° or smaller over an entire periphery of the fluorescent body, and wherein the emission-side end surface has an area of 0.3 mm² or larger and 1.52 mm² or smaller.

The present invention further provides an illumination apparatus comprising a light source oscillating an excitation light and the white light generating device.

According to the present invention, in a device of making an excitation light incident into a fluorescent body to radiate the excitation light and fluorescence and to obtain a white light, it is possible to improve the extraction efficiency of the white light from the fluorescent body and to prevent a color unevenness of the thus obtained white light.

BRIEF DESCRIPTION OF THE DRAWINGS

FIG. 2(a) is a perspective view schematically showing an essential part of the white light generating device of FIG. 1, FIG. 2(b) is a front view showing an emission-side end surface 2f, and FIG. 2(c) is a front view showing an opposing end surface 2e.

EMBODIMENTS FOR CARRYING OUT THE INVENTION

Figure 1:
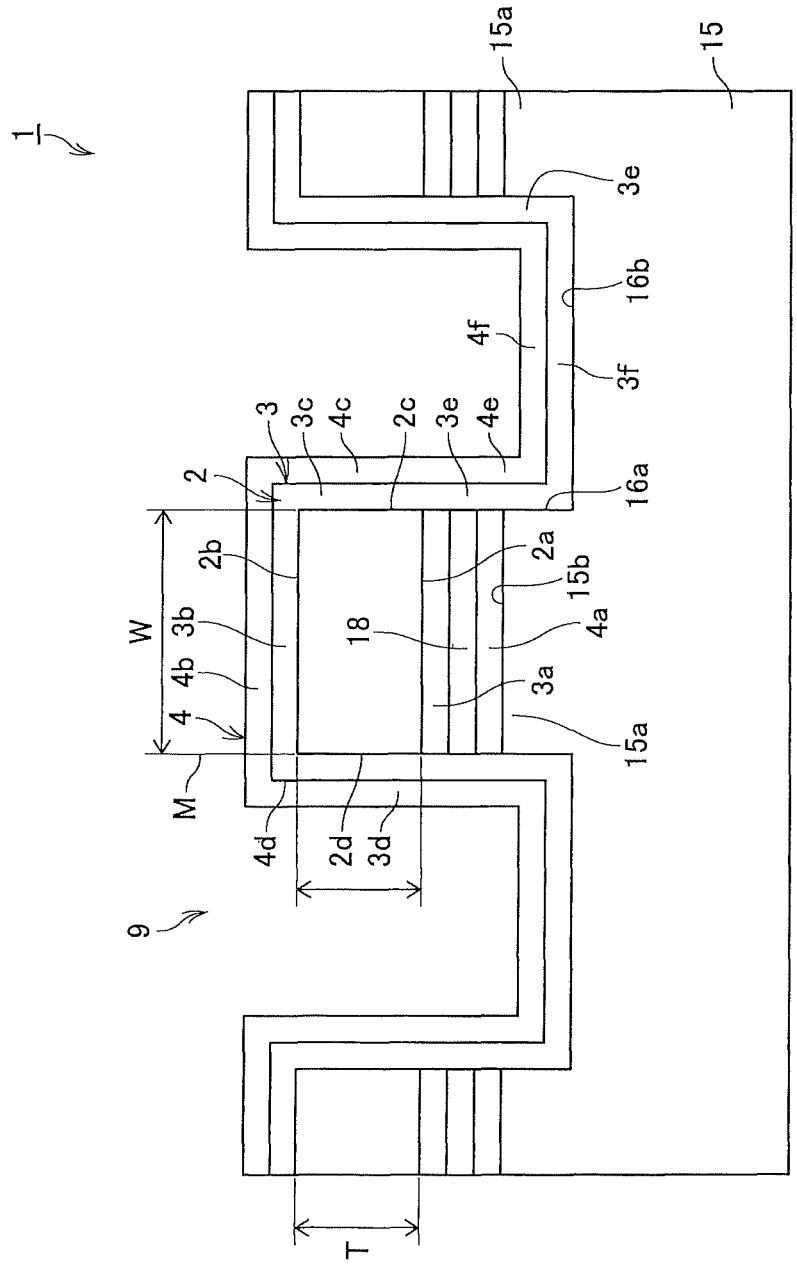
FIG. 1 is a schematic view showing a white light generating device 1 according to an embodiment of the present invention.
Figure 3:
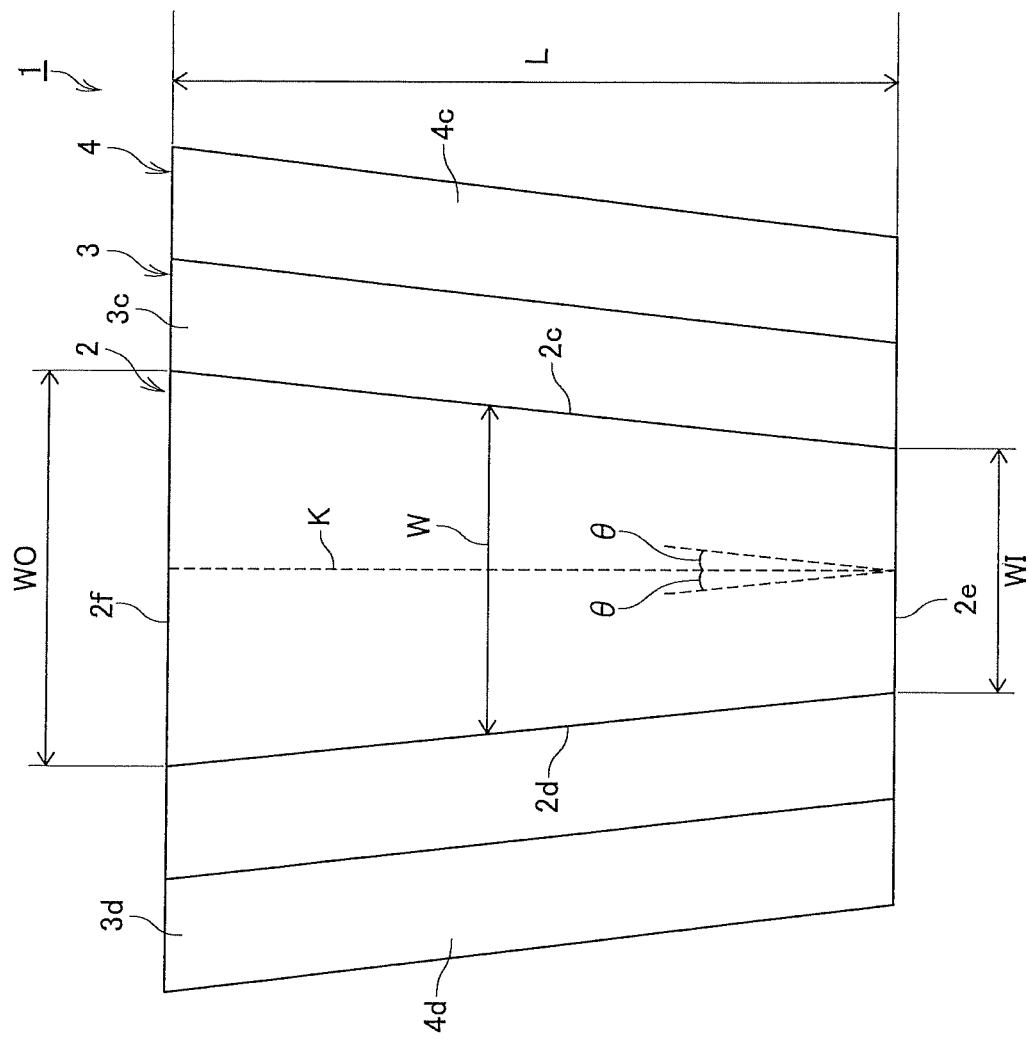
FIG. 3 is a schematic view showing the planar dimensions of the white light generating device 1.

FIGS. 1 to 3 show a white light generating device 1 according to an embodiment of the present invention.

A plurality of protrusions 15a are provided on a supporting substrate 15 of a white light generating device 1, and grooves 16 are provided between the protrusions 15a, respectively. Then, a bottom surface-side reflection film 4a,
bonding layer 18, bottom surface-side low refractive-index film 3a and fluorescent body 2 are provided on the surface 15b of the protrusion 15a.

The bottom surface-side low refractive-index layer 3a is provided on a bottom surface 2a of the fluorescent body 2, an upper surface-side low refractive-index layer 3b is provided on an upper surface 2b, and side surface-side low refractive-index layers 3c and 3d are provided on side surfaces 2c and 2d, respectively. Further, an upper surface-side reflection film 4b is provided on the upper surface-side low refractive-index layer 3b, and side surface-side reflection films 4c and 4d are provided on side surface-side low refractive-index layers 3c and 3d, respectively. A passivation film may be formed on the upper surface-side reflection film 4b, for preventing the deterioration of the reflection film. An oxide film is exemplified as the passivation film.

According to the present embodiment, a side wall surface 16a and bottom wall surface 16b of the groove 16 are covered by recessed part-side low refractive index layers 3e and 3f, respectively, and the recessed part-side low refractive index layers 3e and 3f are covered by recessed part-side reflection films 4e and 4f, respectively. Then, the recessed part-side low refractive index layer 3e and side surface-side low refractive index layer 3c are continuous, and recessed part-side reflection film 4e and side surface-side reflection films 4c and 4d are continuous. 3 represents a low refractive index layer and 4 represents a reflection film.

According to the present invention, an area AO of the emission-side end surface 2f is made larger than an area AI of the opposing-side end surface 2e. Further, the excitation light may be made incident onto the opposing end surface 2e or may be made incident onto the emission-side end surface 2f and then reflected at a reflection film on the opposing end surface 2e by total reflection.

According to the present embodiment, among the fluorescence converted within the fluorescent body 2, the fluorescence reflected at the interface between the fluorescent body 2 and low refractive index layer can be propagated onto the emission-side end surface. Further, a fluorescence, which does not satisfy the total reflection condition of the fluorescent body and incident into the low refractive index layer, is reflected at the respective reflection films provided on the bottom surface, upper surface and side surfaces and is incident into the fluorescent body again. It is thereby possible to increase the light amount of the fluorescence emitted from the emission-side end surface.

Figure 12:
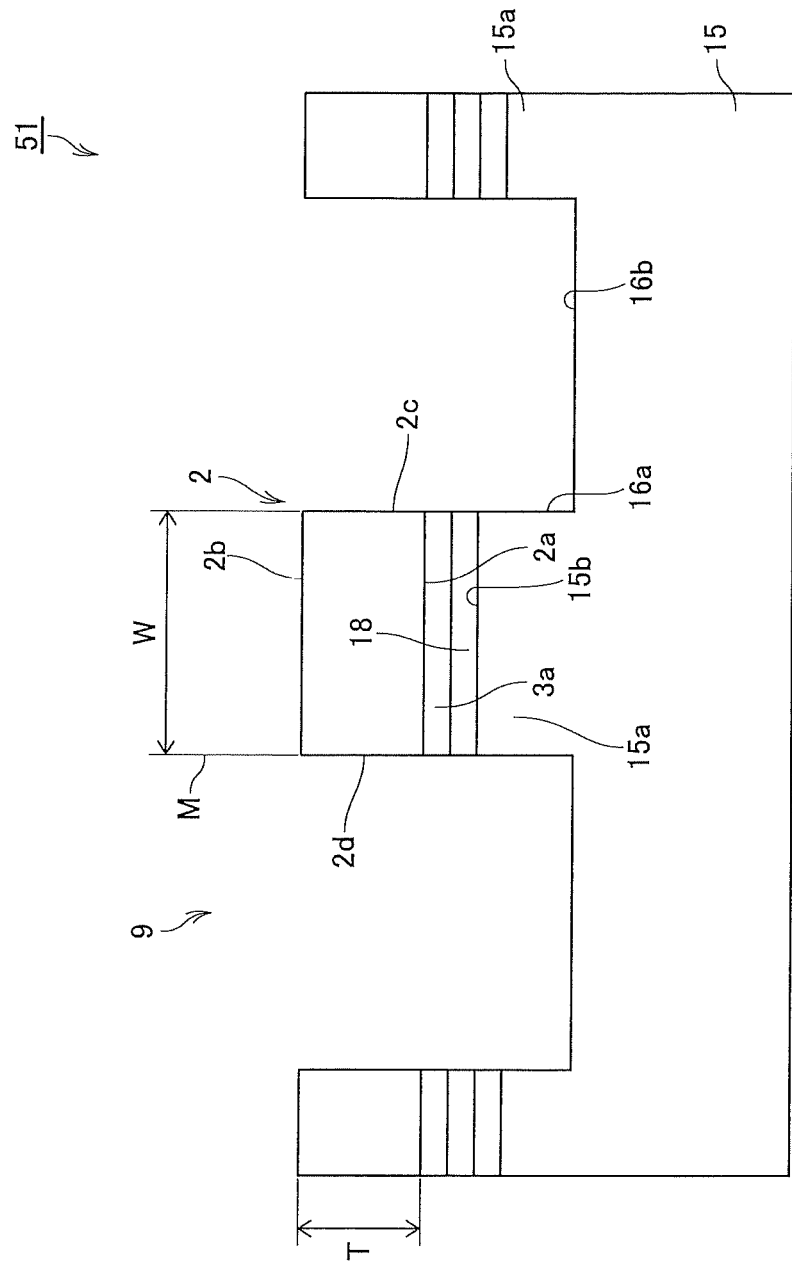
FIG. 12 is a schematic view showing a white light generating device 51 according to another embodiment of the present invention.

Further, according to the present embodiment, as shown in FIG. 12, it is applied in the case that the reflection film is not present on the bottom surface 2a, upper surface 2b and/or side surfaces 2c and 2d of the fluorescent body 2. In this case, the low refractive index layer may not be provided on the upper surface 2b and side surfaces 2c and 2d to provide an air layer.

Further, it is important that an inclined part inclined with respect to a central axis of the fluorescent body is provided on an outer peripheral surface of the fluorescent body. Advantageous effects by this will be further described.

Figure 6:
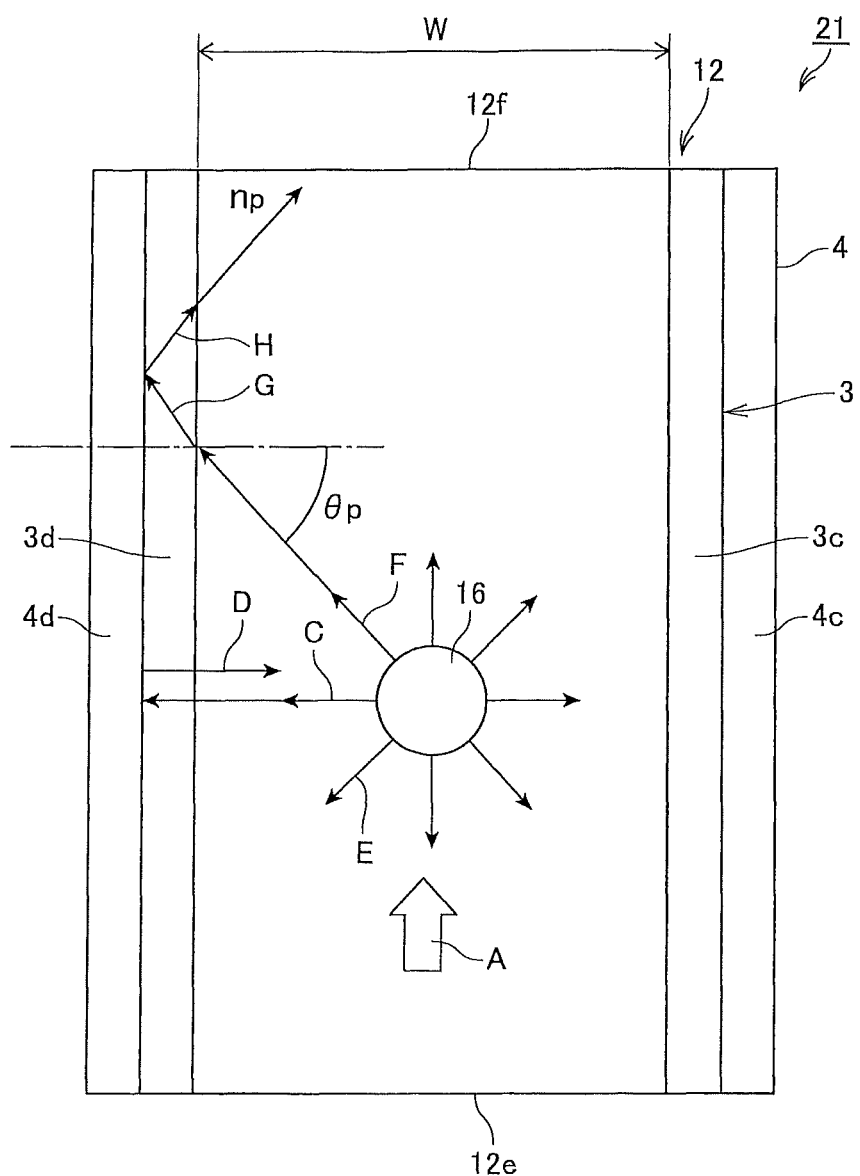
FIG. 6 is a schematic view showing the state of propagation of a light in a white light generating device according to a comparative example.

First, it will be described the case that the inclined part inclined with respect to the central axis is not provided on the outer peripheral surface of the fluorescent body. FIG. 6 relates to this embodiment.

According to a fluorescent body device 21 of a comparative example shown in FIG. 6, the width W and thickness of the fluorescent body 12 are constant. Further, the area of an emission-side end surface 12f and the area of an opposing end surface of the fluorescent body 12 are the same. In this case, as the excitation light A propagates in the fluorescent body 12 and collide with fluorescent body particles 16, a fluorescence emits from the fluorescent body particles 16. At this time, the fluorescence is emitted uniformly from the fluorescent body 16 in all directions.

Here, the fluorescence F radiated from the fluorescent body 16 toward the emission-side end surface 12f reaches the interface with the low refractive index layer at an incident angle θp. Here, the refractive index np of the fluorescent body, refractive index nc of the low refractive index layer and incident angle θp satisfy the total reflection condition, the fluorescence is reflected at the interface, propagates to the emission-side and emitted from the emission-side end surface 12f. On the other hand, when the incident angle θp of the fluorescence does not satisfy the total reflection condition, the fluorescence refracts as an arrow G, reflected at the reflection films 4c and 4d and reflected as an arrow H. The light propagating and repeating such reflection is partly damped due to the absorption by the reflection films and absorption by the fluorescent body therein, and a part of the light reaches the emission-side end surface 12f. However, the fluorescence reaching the emission-side end surface is incident at a large incident angle with respect to the emission-side end surface 12f, so that the light satisfies the total reflection condition between the fluorescent body 12 and air at the emission surface and cannot be extracted from the fluorescent body.

In the case that the low refractive index layer is not provided and the respective reflection films directly contact the fluorescent body, both the excitation light and fluorescence propagate while repeating the reflection at the reflection films. Apart of each of the excitation light and fluorescence is dampened in the fluorescent body as described above, and a substantial part of each of the lights reaching the emission-side end surface 12f is incident onto the emission-side end surface 12f at a large incident angle and thus reflected by total reflection. It is thus difficult to extract the lights out of the fluorescent body.

Fluorescence C generated from the fluorescent body 16 in a direction perpendicular to the lengthwise direction of the fluorescent body is reflected at the reflection film as an arrow D, and repeatedly reflected in the fluorescent body and finally dampened. Further, fluorescence E generated from the fluorescent body particles 16 toward the side of the opposing end surface 12e is repeatedly reflected as described above and finally reaches the opposing end surface.

Contrary to this, according to a device 1 shown in FIG. 3, the width W of an upper surface of the fluorescent body 2 is made gradually larger from the opposing end surface 2e (WI) to the emission-side end surface 2f (WO). Further, θ represents an angle of the central axis K of the fluorescent body 2 with respect to the side surface 2c or side surface 2d. Further, the central axis of the fluorescent body is defined as a straight line connecting the center of the opposing end surface and the center of the emitting surface. According to the present example, the angle θ is constant and in a range of 3.4 to 23° according to the present invention.

Further, although the inclined angle 9 is preferably constant, it is not necessarily constant and may be changed between the emission-side end surface and opposing end surface. Preferably, the width W is smoothly and continuously increased from the opposing end surface to the emission-side end surface.

Figure 7:
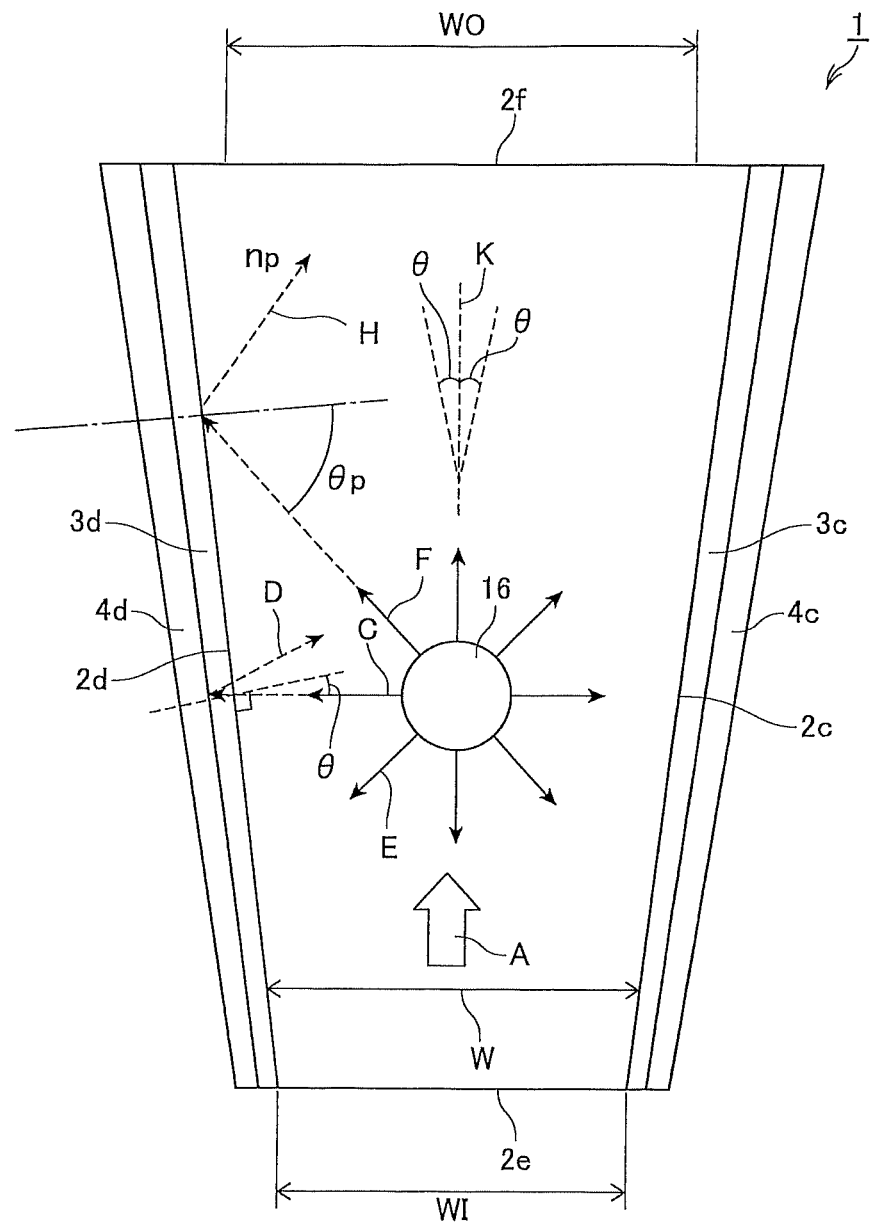
FIG. 7 is a schematic view showing the state of light propagation in the white-light generating device 1.

Here, as shown in FIG. 7, the excitation light A propagates in the fluorescent body and collides the fluorescent body particles 16, so that the fluorescent body particles 16 emit a fluorescence. At this time, the fluorescence is emitted uniformly in all directions from the fluorescent body. Here, the fluorescence F irradiated from the fluorescent body 16 to the emission-side end surface reaches the interface with the low refractive index layer at an incident angle θp. In the case that the refractive index np of the fluorescent body, refractive index nc of the low refractive index layer and incident angle θp satisfy the total reflection condition, the fluorescence is reflected at the interface as an arrow H and propagated to the emission-side.

For example, in the case that the side surface 2d of the fluorescent body is inclined with respect to the central axis K by an angle θ, the incident angle θp of the fluorescence F is made larger than that in the example shown in FIG. 6 by θ, so that the total refection is facilitated at the interface with the low refractive index layer. Thus, the fluorescence which does not satisfy the total reflection condition in the example of FIG. 6 is subject to total reflection at the interface with the low refractive index layer and propagates without the absorption by the reflection film, so that the amount of the emitted light is further increased.

On the contrary, as in the case that the incident angle θp of the fluorescence does not satisfy the total reflection condition, for example, the fluorescence C generated from the fluorescent body 16 in the direction perpendicular to the central axis K of the fluorescent body similarly has the incident angle θ with respect to the low refractive index layer, and the total reflection angle is not to be satisfied at this time. In the case, the fluorescence C is reflected at the reflection film 4d, and then the next incident angle to the interface between the opposing side surface 2c and low refractive index layer 3c is further increased by θ. The reflection is repeated until the total reflection condition is satisfied at the interface between the fluorescent body and low refractive index layer. By this, at the emission-side end surface 12f, the incident angle is reduced and the fluorescence can be extracted to the outside without the total reflection. In the case that the fluorescence is incident to the side surface 2d at the right angle, the fluorescence is reflected at the reflection film 4d so that the incident angle at the interface with the side surface 2c is made larger by θ. The fluorescence then propagates toward the emission-side end surface and the reflection is repeated at the reflection film 4c and reflection film 4d so that the incident angle θp becomes larger. The total reflection condition can be satisfied at the interface between the fluorescent body and low refractive index layer to improve the efficiency of extraction of the fluorescence. The refractive index layer has a lower refractive index than that of the fluorescent body 16 and, as the value is lower, the incident angle satisfying the total reflection condition as described above can be made smaller to facilitate the total reflection. Thus, in the case that the low refractive index layer is composed of air, it is possible to improve the extraction efficiency even when the reflection film is not provided.

As described above, in the case that the outer surface of the fluorescent body 2 is inclined with respect to the central axis K, the incident angle of the fluorescence propagating toward the emission side with respect to the interface between the fluorescent body and low refractive index layer can be made larger, facilitating the total reflection. The fluorescence reflected as such and reaching the emission-side can be extracted efficiently to the outside without the total reflection at the emission-side end surface 12f.

As to the fluorescence E from the fluorescent body 16 to the side of the opposing end surface 2e, the direction is changed by an angle θ toward the side of the emission-side end surface as it is reflected by the reflection film. The propagation direction is changed to the side of the emission-side end surface as multiple reflection is repeated, and the fluorescence is finally propagated and emitted from the emission-side end surface. The fluorescence still reaching the opposing end surface can be reflected by a fluorescence reflection film provided on the opposing end surface and the fluorescence can be finally propagated to and emitted from the emission-side end surface.

Further, the present invention relates to a device for generating a white light from an excitation light of a laser light having a wavelength of 280 nm or higher and 495 nm or lower. The wavelength range corresponds with blue laser light, blue-violet laser light or violet lase light. The laser light of the wavelength range is made incident onto the fluorescent body of the device as the excitation light and the excitation light and fluorescence are emitted from the emission-side end surface.

The wavelength of the fluorescence is preferably made 500 to 800 nm.

At this time, the area of the emission-side end surface is made larger than the area of the opposing end surface and 0.3 mm$^2$ or larger and 1.52 mm$^2$ or smaller. It is possible to make the area of the emission-side end surface larger than the area of the opposing end surface, by providing the inclined surface over the entire periphery of the outer peripheral surface of the fluorescent body. However, as the excitation light having a strong directivity does not expand in the fluorescent body compared with the fluorescence, it is proved that the ratio of intensity of the fluorescence becomes high in a peripheral part of the emission-side end surface resulting in a color unevenness and that it is difficult to use as a fluorescence generating device. Thus, if the area of the emission-side end surface is made 1.52 mm$^2$ or smaller, it is possible to suppress the in-plane distribution of brightness of the emitted fluorescence and to prevent the color unevenness of the white light.

From this viewpoint, the area of the emission-side end surface may preferably be made 1.4=$^2$ or smaller. Further, in the case that the area of the emission-side end surface is below 0.3 mm$^2$, the extraction efficiency of the white light is lowered. The area is thereby made 0.3 mm$^2$ or larger, may preferably be 0.5 mm$^2$ or larger and more preferably be 1.0 mm$^2$ or larger.

In the fluorescent body in which a core part having a higher refractive index is sandwiched between clad parts having lower refractive indices and in a region in which the core is smaller to some degree, the light is repeatedly subjected to total reflection and interferes in the structure, so that there are provided parts in which the light is intensified and parts in which the light is weakened, resulting in a standing wave. Under such circumstances, the propagation speed of the propagating light takes a unique value determined by the refractive indices of the materials, so that the distribution of the optical intensity at the emission-side is also patterned. As the size of the core becomes larger, the light of a so-called multi-mode having multiple propagation speeds is propagated. At this time, in the case that the area of the emission-side end surface is 1.0 mm$^2$ or larger, the distribution of the optical intensity on the emission-side is not patterned and the in-plane distribution becomes random so that the color unevenness is easily generated. The present invention is more useful on this point.

The ratio (AO/AI) of the area AO of the emission-side end surface with respect to the area AI of the opposing end surface may preferably be 2 or larger and more preferably be 3 or larger, from the viewpoint of the present invention.

Further, AO/AI may preferably be 110 or smaller, more preferably be 100 or smaller and most preferably be 90 or smaller.

Figure 4:
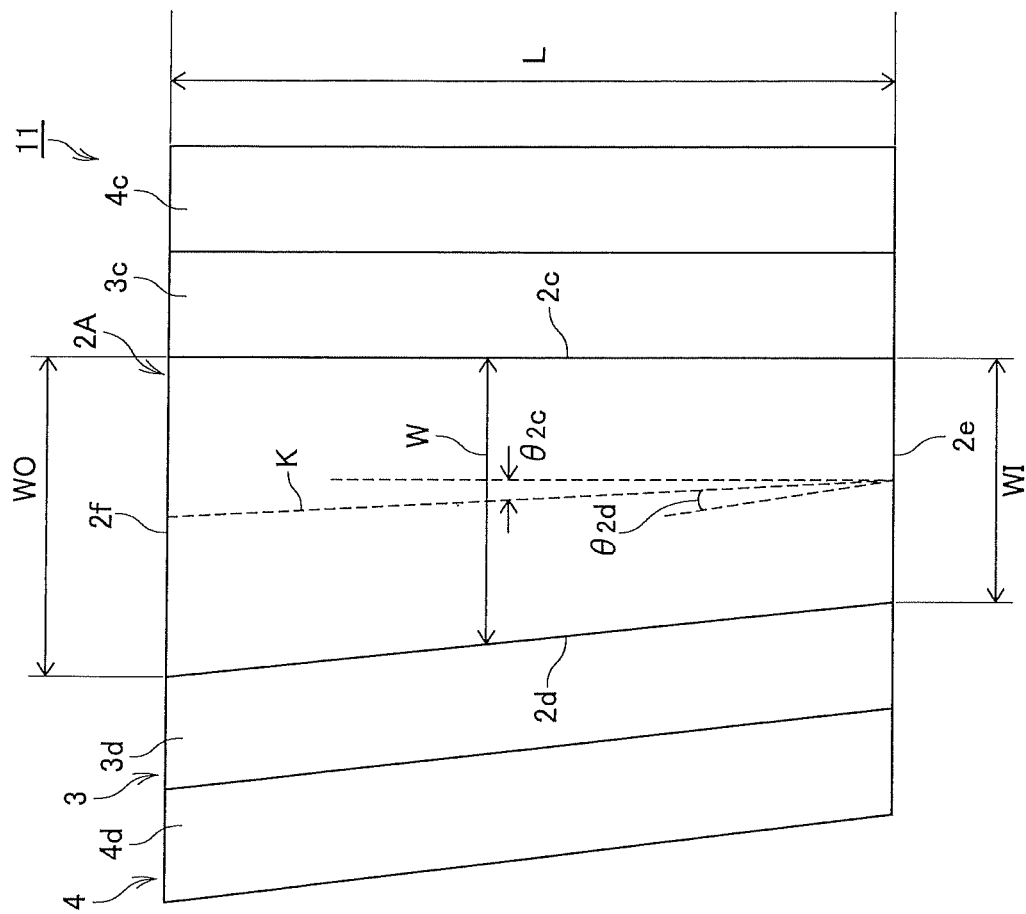
FIG. 4 is a schematic view showing the planar dimensions of a white light generating device 11 according to another embodiment.

According to an embodiment of FIG. 4, the width W of a fluorescent body 2A is WI at the opposing end surface 2$e$ and WO at the emission-side end surface 2$f$. Then, the width W is increased from WI to WO. Further, according to the present example, the angle θ2$c$ or θ2$d$ of the central axis K of the fluorescent body with respect to the side surface 2$c$ or 2$d$ is 3.4 to 23°. According to the present example, the angle of the side surface 2$c$ and central axis K is represented by θ2$c$ and the side surface is inclined with respect to the central axis by the angle θ2$d$.

Figure 5:
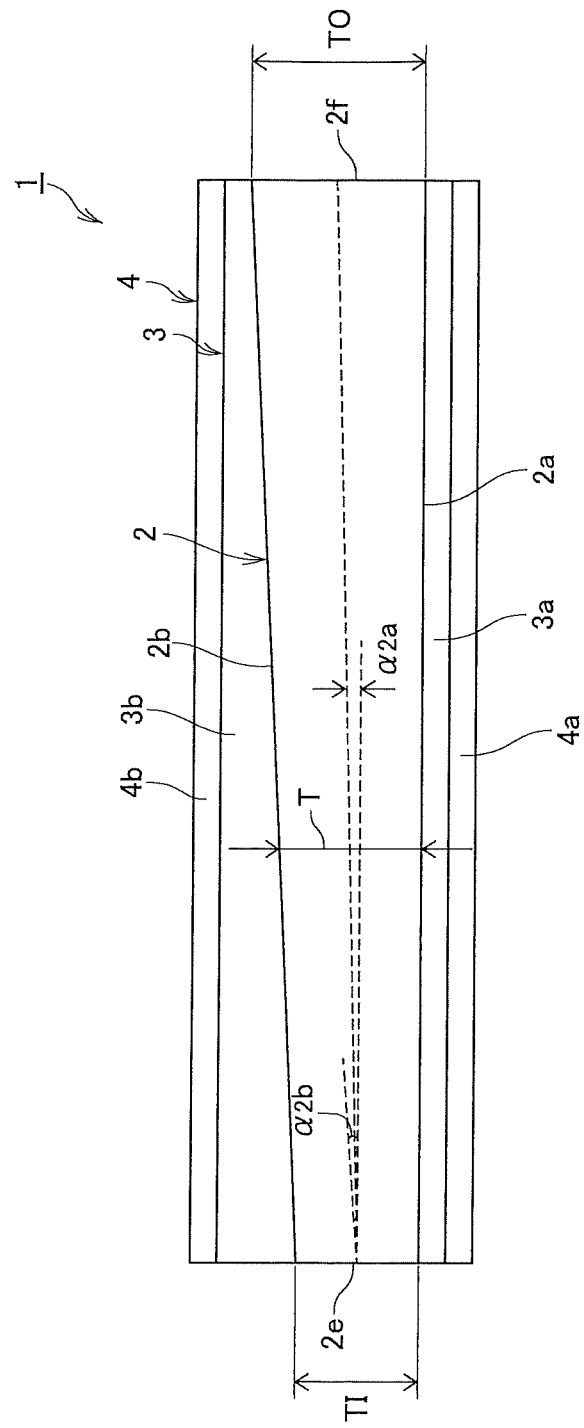
FIG. 5 is a schematic cross-sectional view showing the dimensions in the thickness direction of the white light generating device according to an embodiment of the present invention.

Further, according to an embodiment of the present invention, the thickness of the fluorescent body is increased from the opposing end surface to the emission-side end surface. For example, according to the device shown in FIG. 5, the thickness T of the fluorescent body 2 is TI at the opposing end surface 2$e$ and TO at the emission-side end surface 2$f$. Then, the thickness T is increased from TI to TO.

Further, α2$a$ and α2$b$ represent inclined angles of the central axis K of the fluorescent body 2 with respect to the bottom surface 2$a$ and upper surface 2$b$, respectively. According to the present example, the inclined angles α2$a$ and α2$b$ are constant and 3.4 to 23°, respectively. Although α2$a$ and α2$b$ are preferably constant, they are not necessarily constant and may be changed between the emission-side end surface and opposing end surface. Preferably, the thickness T is continuously and smoothly increased from the opposing end surface to the emission-side end surface.

Further, the effects in the case that the width of the fluorescent body is changed were described above, and the same effects are obtained further in the case that the thickness is changed. The fluorescence reflected at the upper surface and bottom surface can be thereby extracted effectively from the emission-side end surface based on the similar mechanism.

Further, according to the present invention, by applying the structure that both the width W and thickness T are continuously increased from the opposing end surface to the emission-side end surface, the fluorescence generated in the fluorescent body in all directions is reflected based on the total reflection condition of the fluorescent body and low refractive index layer, propagates to the emission-side at a low loss and can be extracted from the emission-side end surface at a high efficiency, so that the fluorescence can be mixed with the excitation light propagating similarly to extract the white light at a high efficiency.

According to the embodiments as described above, the cross-sectional shape of the fluorescent body is made a tetragon. However, the cross-sectional shape of the fluorescent body is not limited to a tetragon, and may be a circle, ellipse or a polygon such as hexagon. Further, in these cases, the inclined part is inclined with respect to the central axis around the entire periphery viewed in a cross section of the fluorescent body.

Figure 8A:
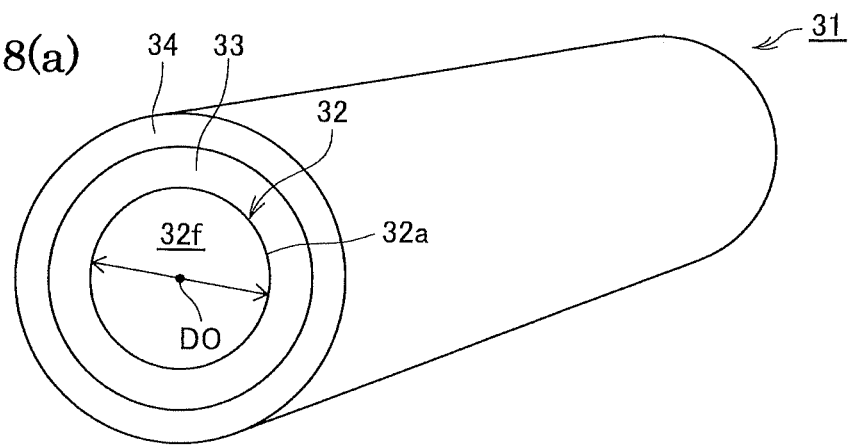
FIG. 8(a) is a perspective view schematically showing a white light generating device 31 according to an embodiment of the present invention.
Figure 8B:
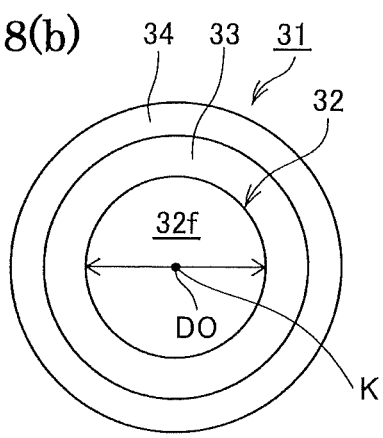
FIG. 8(b) is a front view showing an emission-side end surface 32f.
Figure 8C:
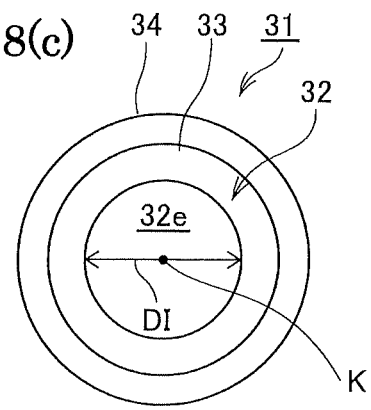
FIG. 8(c) is a front view showing an opposing end surface 32e.

For example, according to a device 31 shown in FIG. 8, a fluorescent body 32 is provided whose cross section is circular. The fluorescent body 32 includes an emission-side end surface 32$f$ shown in FIG. 8($b$), an opposing end surface 32$e$ shown in FIG. 8($c$), and an outer peripheral surface 32$a$ between the emission-side end surface and opposing end surface. A low refractive index layer 33 is provided on the outer peripheral surface 32$a$ of the fluorescent body 32, and a reflection film 34 is provided on the low refractive index layer 32. The diameter DO of the emission-side end surface 32$f$ is larger than the diameter DI of the opposing end surface 32e, and the outer peripheral surface 32a forms an inclined surface inclined with respect to the central axis K by an angle of 3.4 to 23°.

According to a preferred embodiment, the width of the fluorescent body is changed from the upper surface to the bottom surface. For example, according to a device 41 shown in FIG. 9, a fluorescent body 42 has a cross section of a shape of a trapezoid and elongate shape. An outer peripheral surface is elongated between the emission-side end surface 42f and opposing end surface 42e of the fluorescent body 42, and the outer peripheral surface includes an elongate bottom surface 42a, an upper surface 42b opposing the bottom surface 42a, and a pair of side surfaces 42c and 42d. Then, a low refractive index layer 3 covers the outer peripheral surface of the fluorescent body 42 and a reflection film 4 covers the low refractive index layer 3.

Then, the width of the fluorescent body 42 is gradually increased from the width at the upper surface to the width at the bottom surface. Further, p represents an inclination angle of the side surface 42c (42d) with respect to the normal line M of the bottom surface 42a of the fluorescent body 42.

Although it is not expected that the effect of increasing the emission light amount of the fluorescence is only by the present structure itself, it is possible to further improve the emission light amount of the fluorescence, by combining the present structure with the structure that it is inclined in the thickness direction of the fluorescence by an inclination angle ($\alpha 2a + \alpha 2b$). That is, in the case that the side surface is inclined by an inclination angle β, as the fluorescence, propagating in the width direction of the fluorescent body, is reflected at this side surface or at a reflection surface in parallel with the side surface, the fluorescence propagates in the thickness direction of the fluorescent body. Thus, even in the case that the inclination angle θ is small in the width direction of the fluorescent body, the fluorescence can be propagated to the emission-side in combination with the inclination in the thickness direction, so that the amount of the emitted light can be increased.

Figure 10:
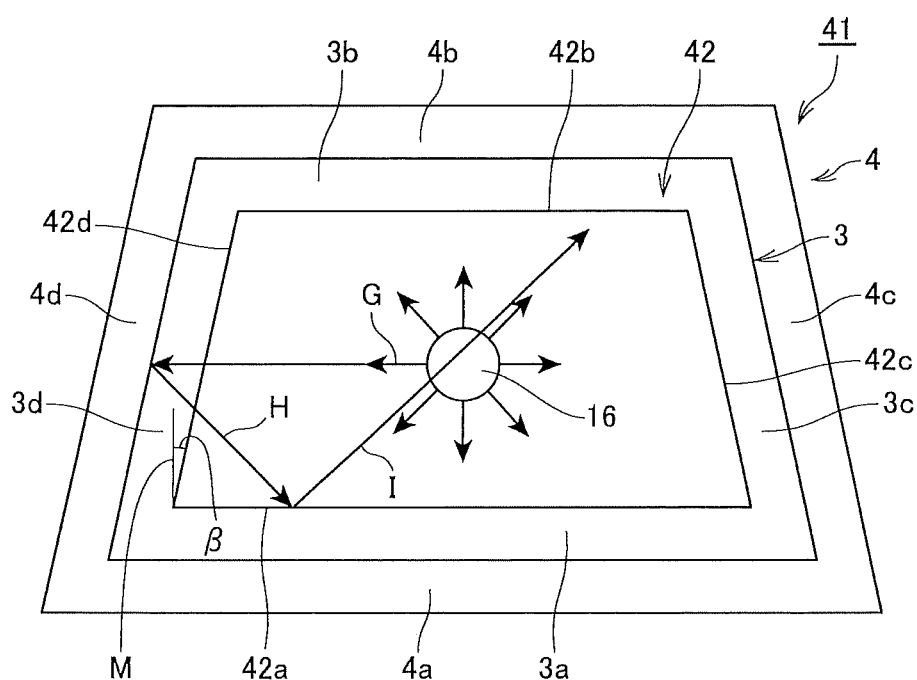
FIG. 10 is a schematic view illustrating the propagation of light in a cross section of the white light generating device 41.

The effects of the present embodiment will be described referring to FIG. 10.

According to the present example, the fluorescence is irradiated in all directions from the fluorescent body particle 16 and light G irradiated horizontally is reflected by the side surface 42c (42d) as an arrow H. At this time, as the side surface 42c (42d) is inclined with respect to the normal lime M of the bottom surface, the fluorescence is then reflected toward the bottom surface and then reflected at the bottom surface as an arrow I. While this multiple refection is repeated, the fluorescence is to be reflected at the upper surface, bottom surface and side surfaces and is not repeatedly reflected between the side surfaces. Here, as at least one of the width and thickness of the fluorescent body is changed between the emission-side end surface and opposing end surface as described above, the irradiation to the emission-side end surface of the fluorescence is facilitated. In the case that this inclination is applied, the fluorescence reflected at the side surface is directed into the light reflected at the upper and bottom surfaces. By this, it is combined with the structure in which the thickness is changed, the whole of the fluorescence generated within the fluorescent body can be emitted as propagating light into the emission-side end surface at a high efficiency, and it is possible to extract a white light by mixing it with the excitation light similarly propagated.

According to the above examples, although the width of the fluorescent body at the bottom surface is made larger than the width of the fluorescent body at the upper surface, the width of the fluorescent body at the bottom surface may be made smaller than the widths of the fluorescent body at the upper surface. From this viewpoint, either of the width of the fluorescent body may be made zero to provide a triangular shape. Further, although the width of the fluorescent body may preferably be changed smoothly, the width may be changed stepwise.

According to a preferred embodiment, a reflection part reflecting the fluorescence is provided on the opposing end surface. The reflection part reflecting the fluorescence may reflect or transmit the excitation light.

The opposing end surface may be an incident surface onto which the excitation light is made incident. In this case, it is preferred to form a film on the side of the opposing end surface which is totally reflective with respect to the fluorescence and non-reflective with respect to the excitation light. Alternatively, only a film which is non-reflective with respect to the excitation light may be formed.

Further, a film may be formed on the emission side end surface which is non-reflective with respect to the fluorescence and excitation light.

Alternatively, the emission-side end surface may be an incident surface onto which the excitation light is made incident. In this case, a reflection film is provided on the opposing end surface which is totally reflective with respect to the excitation light and fluorescence.

The waveguide-type fluorescence device of the present invention may be a non-grating type fluorescence device which does not include a grating within the fluorescent body or a grating device.

According to the present invention, the outer peripheral surface of the fluorescent body includes an inclination part inclined by 3.4° or larger and 23° or smaller with respect to the central axis of the fluorescent body over the entire periphery. It is possible to improve the optical intensity oscillated from the emission-side end surface by raising the inclination angle to 3.4° or larger. From this viewpoint, the inclination angle may preferably be made 7.5° or larger. Further, in the case that the inclination angle exceeds 23°, the color unevenness of the white light emitted from the emission-side end surface is larger. The inclination angle is thus made 23° or smaller and more preferably 21° or smaller.

Further, as to the area of the inclination part, it is not necessarily provided over the whole length of the outer peripheral surface of the fluorescent body, and it is permitted that it is provided in a part of the outer peripheral surface over the entire periphery. As to the area of the inclination part, it may preferably occupy 30% or higher, more preferably occupy 50% or higher and may occupy 100% of the area of the outer peripheral surface of the fluorescent body.

From the viewpoint of coupling the excitation light effectively and improving the amount of the emitted light, the width and diameter W of the fluorescent body may preferably be 20 μm or larger and more preferably be 50 μm or larger. Further, from the viewpoint of the present invention, W may preferably be 900 μm or smaller, and more preferably be 500 μm or smaller and particularly preferably be 300 μm or smaller, from the viewpoint of performing optical waveguide propagation.

From the viewpoint of coupling the excitation light effectively and increasing the amount of the emitted light, the thickness T1 of the fluorescent body at the opposing end surface may preferably be 20 μm or larger and more preferably be 50 μm or larger. Further, from the viewpoint of the present invention, T may preferably be made 900 μm or smaller, and preferably be made 500 μm or smaller, on the viewpoint of optical waveguide propagation. Further, from the viewpoint of reducing the influences due to scattering caused by the surface roughness at the side surfaces during the formation of the optical waveguide, T may preferably be 200 μm or smaller and more preferably be 150 μm or smaller.

The inclination angles β of the respective side surfaces with respect to the normal line M of the bottom surface of the fluorescent body at the opposing end surface (refer to FIGS. 9 and 10) may preferably be 10° or larger and more preferably be 15° or higher, from the viewpoint of increasing the amount of the emitted light. Further, β may preferably be 50° or smaller and more preferably be 35° or smaller.

Although the length L of the fluorescent body (distance between the emission-side end surface and opposing end surface) (refer to FIG. 3) is not particularly limited, the length may preferably be 200 μm or larger, as it is generally necessary to repeat the reflection until the fluorescence is propagated. The length may be made 2 mm or smaller for reducing the loss accompanied with the propagation.

According to a preferred embodiment, a groove including a side wall surface and bottom wall surface is formed in a supporting substrate, a recess-side low refractive index layer is provided covering the side wall surface and bottom wall surface and a recess-side reflection film provided on the recess-side low refractive index layer, the recess-side low refractive index layer and side surface-side low refractive index layer are continuous, and the recess-side reflection film and side surface-side reflection film are continuous. For example, according to an embodiment shown in FIG. 11, the device shown in FIGS. 1 and 8 to 10 is provided on a dissipation substrate 15. Although the fluorescence incident at an angle which does not satisfy the total reflection condition at the interface between the fluorescent body and low refractive index layer is usually irradiated into the low refractive index layer without being reflected, the fluorescence is reflected by the respective reflection films in this case. Thus, the fluorescence is repeatedly subjected to this reflection and propagated in the fluorescent body to reach the emission-side end surface.

Further, the improvement of the heat dissipation property is listed as the effect of the present embodiment.

As heat is generated in the fluorescent body due to the conversion of the excitation light to the fluorescence and the temperature of the fluorescent body itself is raised due to the heat generation, the conversion efficiency is lowered and the balance of the amounts of the excitation light and the fluorescence is changed to result in a color unevenness. Further, there may be the case that the light is absorbed into the reflection film to thereby cause heat generation in the reflection film to raise the temperature of the fluorescent body and to change the optical characteristics similarly.

However, according to the present embodiment, the heat generated in the fluorescent body is directly radiated into the supporting substrate through the low refractive index layer and reflection film on the side of the bottom surface through a heat conduction path and, in addition to this, the heat is conducted through the low refractive index layers and reflection film provided on the upper surface, and the respective side surfaces toward the recess-side low refractive index layer and recess-side reflection film into the supporting substrate and is radiated into the supporting substrate. It is thereby possible to suppress the reduction of the conversion efficiency due to the thermal deterioration of the fluorescent body and to thereby suppress the deviation of the color unevenness due to the heat generation.

The material of the reflection film may be a metal film of gold, aluminum, copper, silver or the like, or a film of a mixed crystal containing the metal component, or a dielectric multi-layered film. In the case that the metal film is used as the reflection film, a metal layer such as Cr, Ni, Ti or the like may be formed as a buffer layer for the metal film for preventing the peeling of the low refractive index layer.

The material of the low refractive index layer may be a material whose refractive index is lower than that of the fluorescent body. The difference in the refractive indices of the low refractive index layer and fluorescent body may preferably be 0.05 or larger. The material of the low refractive index layer may preferably be $SiO_2$, $Al_2O_3$, $MgF_2$, $CaF_2$, MgO or the like. Further, considering the heat conduction path described above, the thermal conductivity of the low refractive index layer may preferably be larger, and $Al_2O_3$ is most preferred from this viewpoint.

A buffer layer may be provided between the low refractive index layer and reflection film. Although the material of the bonding layer is not particularly limited, aluminum oxide, tantalum oxide or titanium oxide are preferred. However, a material is preferred whose thermal conductivity is higher than that of the fluorescent body, and aluminum oxide is most preferred from this viewpoint.

The fluorescent body may be a phosphor glass, a monocrystal, or a polycrystal. The phosphor glass is constructed by diffusing rare earth ions in a glass serving as a base.

As the glass serving as the base, an oxide glass containing silica, boron oxide, calcium oxide, lanthanum oxide, barium oxide, zinc oxide, phosphorus oxide, aluminum fluoride, magnesium fluoride, calcium fluoride, strontium fluoride, or barium chloride may be exemplified, and may be YAG (yttrium aluminum garnet).

Though the rare earth ions diffused in the glass are preferably Tb, Eu, Ce, and Nd, the rare earth ions may be La, Pr, Sc, Sm, Er, Tm, Dy, Gd, or Lu.

As the phosphor monocrystal, $Y_3Al_5O_{12}$ (YAG), $Ba_5Si_{11}Al_7N_{25}$, $Tb_3Al_5O_{12}$, $(Lu_{1-x}Ce_x)_{3+d}Al_{5-d}O_{12}$ (LuAG) and sialon are preferable. Further, a dopant doped in the fluorescent body can be rare earth ions such as Tb, Eu, Ce, Cu, Nd or the like. The fluorescent body is preferably a monocrystal from such a viewpoint as suppression of the thermal degradation, but even a polycrystal can decrease the heat resistance at grain boundaries, and can increase the transmittance if the polycrystal is a dense body, and can thus function as the white light generating device of a low loss.

For further reducing the color unevenness of the white light radiated from the emission-side end surface, it is possible to use a fluorescent body having the structure of scattering the excitation light and fluorescence within the fluorescent body. For scattering the lights, it is known the structures of adding an impurity into the fluorescent body for adjusting the sintering temperature for the devitrification, and of incorporating air bubbles.

According to a preferred embodiment, the linear transmittance at a wavelength of 560 nm of the fluorescent body having a thickness of 1 mm is made 10% or higher and 95% or lower (preferably 15 to 90%).

As a light source, a semiconductor laser is preferred composed of GaN material having high a reliability for exciting a fluorescent body for illumination. A light source such as a laser array or the like arranged one-dimensionally is further applicable.

As the heat dissipation substrate 15, alumina, aluminum nitride, silicon carbide, silicon, silicon nitride, tungsten, copper-tungsten, magnesium oxide or the like may be listed.

EXAMPLES

Experiment A

A phosphor device 1 was produced having the shape shown in FIGS. 1 to 3.

Specifically, on a heat dissipation substrate 15 having a thickness of 1 mm and composed of a 4-inch wafer made of aluminum nitride, a peeling prevention film (not shown) of $Al_2O_3$ of 0.2 μm was film-firmed and a reflection film of Al of 0.5 μm by sputtering. A bonding layer of $Al_2O_3$ of 0.3 μm was then film-formed. Further, a low refractive index oxide film (low refractive index layer) of $Al_2O_3$ was film-formed in a thickness of 0.3 μm on a 4-inch phosphor wafer having a thickness of 1 mm and composed of polycrystalline YAG (yttrium aluminum garnet) doped with Ce whose linear transmittance is 50% per thickness of 1 mm at a wavelength of 560 nm. Further, both were adhered with each other at the respective $Al_2O_3$ layers by direct bonding at ambient temperature using an ion gun.

A blade was used having a width of 100 μm and of #800 to perform a plurality of grinding processes by dicing to form two lines of grooves, and ridge type optical waveguides were formed in which the widths W of the input part were fixed at 150 μm, the thicknesses T were fixed at 100 μm, the inclination angles θ in the horizontal direction were changed in 0 to 25° and the inclination angles $\alpha 2a$ and $\alpha 2b$ were changed, respectively. Samples were thus produced having areas of the fluorescent bodies at the emission-side different from each other.

A low refractive index layer of $Al_2O_3$ of 0.3 μm was further formed on the surface with the ridge type optical waveguide formed, a reflection film of Al of 0.5 μm and a protective film (not shown) of $Al_2O_3$ of 0.2 μm.

After the film formation, the composite wafer was cut into bar-shaped bodies each having a length of 2 mm of fluorescent body by dicing using a blade of a width of 200 μm and of #4000, and both end surfaces were subjected to optical polishing. Thereafter, on the emission-side end surface, a dichroic film was film-formed which is non-reflective with respect to a wavelength of 450 nm of the excitation light and totally reflective with respect to a wavelength of 560 nm of the fluorescence by a IBS (Ion-beam Sputter Coater) film-forming system.

Finally, the blade used for the cutting after the film formation was utilized to cut into chips each having a width of 1 mm, and the white light generating devices of the respective examples were produced.

The respective devices of the chips were subjected to evaluation of illumination light using a GaN-based blue laser light source of an output power of 3 W. The results of the evaluation of the devices of the respective examples were shown in Tables 1 and 2.

(Output Power of while Light)

The output power of white light (average output power) indicates an average per time of total luminous flux. Total luminous flux measurement is carried out by using an integrating sphere (integrating photometer), turning on a light source to be measured and a standard light source, in which the total luminous flux is correlated to values, at the same position, and comparing them with each other. The, measurement was carried out by using a method prescribed in JIS C7801 in detail.

(In-Plane Distribution of Color Unevenness)

Emitted light was evaluated in the chromaticity diagram by using a luminance distribution measurement device. Then, the case where the distribution is in a range of a median x: 0.3447±0.005 and y: 0.3553±0.005 is determined to be a case without the uneven color, and cases where the distribution is not in this range is determined to be a case with the uneven color in the chromaticity diagram.

TABLE 1

|  | Com. Ex. 1 | Com. Ex. 2 | Inv. Ex. 1 | Inv. Ex. 2 | Inv. Ex. 3 | Inv. Ex. 4 | Inv. Ex. 5 | Unit |
|---|---|---|---|---|---|---|---|---|
| Area AO of Emitting surface | 0.02 | 0.23 | 0.30 | 0.39 | 0.55 | 0.77 | 1.01 | mm² |
| Inclination angle θ of side surface | 0 | 10 | 10 | 10 | 15 | 15 | 15 | ° |
| Inclination angle α2a in thickness direction | 0 | 2.51 | 3.51 | 5.04 | 5.04 | 7.63 | 10.31 | ° |
| Inclination angle α2b in thickness direction | 0 | 2.49 | 3.49 | 4.96 | 4.96 | 7.37 | 9.69 | ° |
| Inclination angle β of side surface at cross section | 0 | 0 | 0 | 0 | 0 | 0 | 0 | ° |
| Output power of white light | 1181 | 1450 | 1650 | 1750 | 2000 | 2200 | 2300 | 1 m |
| In-plane distribution of Color unevenness | None | None | None | None | None | None | None | — |

※ output value: "white light"

TABLE 2

|  | Inv. Ex. 6 | Inv. Ex. 7 | Com. Ex. 3 | Com. Ex. 4 | Unit |
|---|---|---|---|---|---|
| Area AO of Emitting surface | 1.33 | 1.52 | 1.75 | 2.08 | mm² |
| Inclination angle θ of side surface | 20 | 23 | 23 | 25 | ° |
| Inclination angle α2a in thickness direction | 10.31 | 10.31 | 11.98 | 13.12 | ° |
| Inclination angle α2b in thickness direction | 9.69 | 9.69 | 11.02 | 11.88 | ° |
| Inclination angle β of side surface at cross section | 0 | 0 | 0 | 0 | ° |
| Output power of white light | 2450 | 2500 | 2500 | 2500 | lm |
| In-plane distribution of Color unevenness | None | None | Present | Present | — |

※ output value: "white light"

As can be seen from Tables 1 and 2, according to the present invention, it was possible to maintain the high output power of the white light and, at the same time, to suppress the in-plane distribution of the color unevenness.

(Experiment B)

Figure 9:
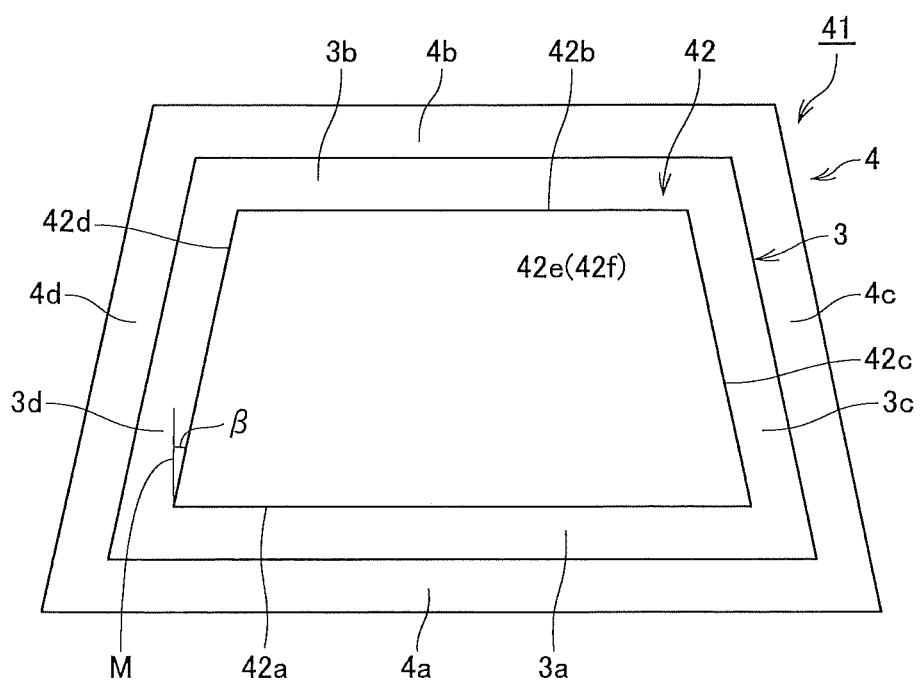
FIG. 9 is a schematic view showing a cross section of a white light generating device 41.
Figure 11:
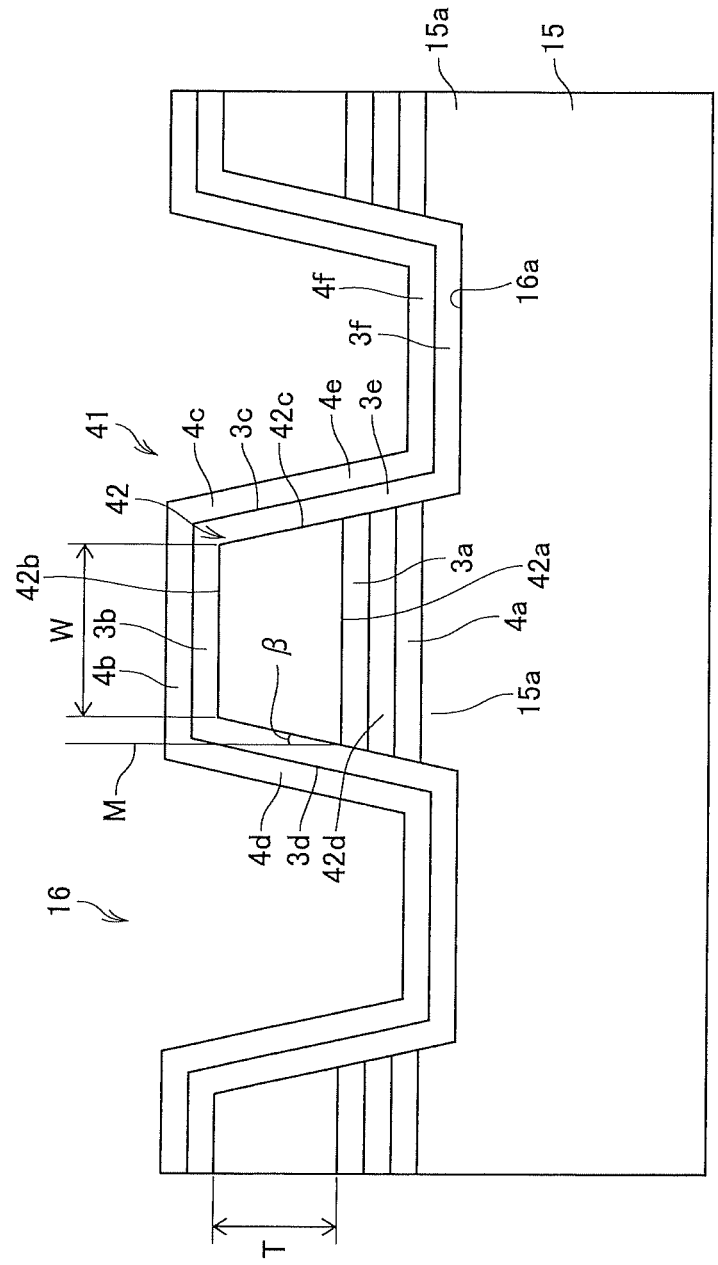
FIG. 11 is a schematic view showing an embodiment in which the white light generating device 41 of FIGS. 9 and 10 is provided on a heat dissipating substrate 15.

The devices of the respective examples shown in Table 3 were produced according to the same procedure as Experiment A. However, according to the present example, as shown in FIGS. 9 to 11, the angle β of the side surface with respect to the normal line to the bottom surface of the fluorescent body was changed as shown in table 3. At this time, as to the processing of the fluorescent body, two lines of the grooves were processed by set-back process by dicing using a blade of a width of 100 μm and of #800, to form the ridge type waveguide of a trapezoid shape. The output power of the white light and in-plane distribution of color unevenness of the devices of the respective examples were measured and shown in Table 3.

TABLE 3

|  | Inv. Ex. B1 | Inv. Ex. B2 | Inv. Ex. B3 | Unit |
|---|---|---|---|---|
| Area AO of Emitting surface | 0.9 | 0.9 | 0.9 | mm² |
| Inclination angle θ of side surface | 15 | 15 | 3.5 | ° |
| Inclination angle α2a in thickness direction | 10.31 | 10.31 | 10.31 | ° |
| Inclination angle α2b in thickness direction | 9.69 | 9.69 | 9.69 | ° |
| Inclination angle β of side surface at cross section | 0 | 13 | 13 | ° |
| Output power of white light | 2100 | 2150 | 2050 | lm |
| In-plane distribution of Color unevenness | None | None | None | — |

As can be seen from Table 3, according to the present invention, it was possible to maintain the high output power of the white light and, at the same time, to suppress the in-plane distribution of color unevenness and, moreover, it was possible to further improve the output power of the white light by raising the angle β.

The invention claimed is:

1. A white light generating device for generating a white light from an excitation light comprising a laser light having a wavelength from 280 nm to 495 nm,
   said white light generating device comprising a fluorescent body and a heat dissipation substrate for supporting said fluorescent body, said fluorescent body generating a fluorescence having a wavelength longer than a wavelength of said excitation light, said fluorescent body comprising an emission-side end surface for emitting said excitation light and said fluorescence, an opposing end surface on an opposite side of said emission-side end surface, and an outer peripheral surface,
   said emission-side end surface having an area larger than the area of said opposing end surface,
   said outer peripheral surface of said fluorescent body comprising an inclined part inclined with respect to a central axis of said fluorescent body by from 3.4° to 23° over an entire periphery of said fluorescent body,
   said emission-side end surface having an area of from 0.3 mm² to 1.52 mm²,
   said outer peripheral surface of said fluorescent body comprising a bottom surface, an upper surface opposing said bottom surface and a pair of side surfaces between said bottom surface and said upper surface,
   said heat dissipation substrate comprising a protrusion and a groove, and
   said white light generating device further comprising:
   a bottom surface-side low refractive-index layer on said bottom surface of said fluorescent body,
   an upper surface-side low retractive-index layer on said upper surface,
   a side surface-side low refractive-index layer on one of said side surfaces,
   a bottom surface-side reflection film on said side surface-side low refractive-index layer,
   an upper surface-side reflection film on said upper surface-side low refractive-index layer,
   a side surface-side reflection film on said side surface-side low refractive-index layer,
   a recessed part-side low refractive index layer covering a side wall surface and bottom wall surface of said groove, and
   a recessed part-side reflection film covering said recessed part-side low refractive index layer,
   said recessed part-side low refractive index layer and said side surface-side low refractive index layer are continuous, and
   said recessed part-side reflection film and said side surface-side reflection film are continuous.

2. The device of claim 1, wherein a width of said upper surface of said fluorescent body is increased from said opposing surface toward said emission-side end surface.

3. The device claim 1, wherein a thickness of said fluorescence body is increased from said opposing end surface toward said emission-side end surface.

4. The device of claim 1, wherein an inclination angle of each of said side surfaces with respect to a normal line to said bottom surface is from 50°-10°.

5. The device of claim 1, further comprising a reflection part reflecting said fluorescence provided on said opposing end surface.

6. The device of claim 1, wherein said opposing end surface comprises an incident surface for making said excitation light incident.

7. An illumination system comprising a light source oscillating an excitation light and a white light generating device,
   wherein said white light generating device comprises the white light generating device of claim 1.

8. The device of claim 1, wherein said fluorescent body has a cross sectional shape of a trapezoid.

* * * * *